US006538320B1

(12) United States Patent
Tosaya et al.

(10) Patent No.: US 6,538,320 B1
(45) Date of Patent: Mar. 25, 2003

(54) HEAT SPREADER HAVING HOLES FOR RIVET-LIKE ADHESIVE CONNECTIONS

(75) Inventors: Eric S. Tosaya, Fremont, CA (US); Edward S. Alcid, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/892,778

(22) Filed: Jun. 28, 2001

Related U.S. Application Data
(60) Provisional application No. 60/214,450, filed on Jun. 28, 2000.

(51) Int. Cl.$^7$ ............................ H01L 23/10; H01L 23/34
(52) U.S. Cl. .................................... 257/706; 438/122
(58) Field of Search .................. 257/276, 706, 257/707, 712, 713

(56) References Cited

U.S. PATENT DOCUMENTS 5,397,917 A * 3/1995 Ommen et al. ............ 257/698
5,783,860 A * 7/1998 Jeng et al. ................. 257/675
5,929,513 A * 7/1999 Asano et al. .............. 257/675

FOREIGN PATENT DOCUMENTS

JP 05211250 A * 8/1993

* cited by examiner

Primary Examiner—Olik Chaudhuri
Assistant Examiner—Dana Farahani

(57) ABSTRACT

A heat spreader-package assembly is provided having a heat spreader mounted to a package board with an adhesive. The heat spreader has an upper portion and a plurality of sidewalls extending from the upper portion. The heat spreader has a flange that extends from the sidewalls continuously about a periphery of the upper portion and has a plurality of holes. The holes allow the uncured adhesive to flow therethrough. When the adhesive has cured, a head is formed from the adhesive on an upper side of the flange to establish a riveted connection.

16 Claims, 5 Drawing Sheets

HEAT SPREADER HAVING HOLES FOR RIVET-LIKE ADHESIVE CONNECTIONS

RELATED APPLICATIONS

This application claims priority from U.S. Provisional Application Serial No. 60/214,450, filed Jun. 28, 2000, incorporated herein by reference.

BACKGROUND OF THE INVENTION

1. Field of the Invention

The present invention relates to the packaging of integrated circuits and, more particularly, to an attachment of a heat spreader to an integrated circuit package.

2. Description of Related Art

A top view of a conventional heat spreader-package assembly 10 is shown in FIG. 1. The conventional heat spreader 11 has a substantially square upper portion 12 with sidewalls 14 extending from the edges of the upper portion 12. A flange 16 extends from the sidewalls 14 and is substantially parallel to an upper portion 12 of the package.

A side sectional view of the conventional heat spreader-package assembly 10 is shown in FIG. 2. The assembly includes package board 18 having an integrated circuit die 20 mounted thereto. The heat spreader 11 is mounted to the package board 18 and serves both to protect physically the integrated circuit die 20 and spread the heat generated by the die 20. An adhesive 22 is placed between the flange 16 and the upper surface of the package board 18 to hold the heat spreader 11 in place.

There are problems, however, with conventional heat spreader-package assemblies. For example, as shown in FIG. 2, the adhesive contacts only the upper surface of the package board and the underside of the flange. That is, there is no force that will act against the upper surface of the flange to hold the flange against the package board to resist upward forces on the spreader 11. Thus, the connection between the heat spreader and the package is somewhat weaker than may be desirable.

SUMMARY OF THE INVENTION

There is a need for a heat spreader having a stronger connection between the heat spreader and the package board. More specifically, there is a need for a heat spreader-package assembly in which an adhesive acts on an upper side of the flange to hold the heat spreader firmly in place.

These and other needs are met by embodiments of the present invention which provides a heat spreader having an upper portion; a plurality of sidewalls extending from the upper portion; and a flange extending from the sidewalls and having a plurality of holes adapted to allow an adhesive to flow therethrough to establish a riveted connection between the heat spreader and an integrated circuit package.

One advantage of such a heat spreader is that the adhesive, after it has flowed through the holes cured, forms a riveted connection between the heat spreader and the integrated circuit package board. Thus, a force acts on the upper surface of the flange to hold the heat spreader more firmly in place.

The earlier stated needs are also met by another embodiment of the present invention which provides a method of attaching a heat spreader to a package of a semiconductor device, comprising forming holes in a flange of the heat spreader; placing an adhesive on an upper surface of the package; bringing the flange of the heat spreader into contact with the adhesive; allowing the adhesive to partially flow through the holes; and curing the adhesive to establish a riveted connection between the heat spreader and the package.

Additional advantages and novel features of the invention will be set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF DESCRIPTION OF THE DRAWINGS

Preferred embodiments of the invention will be described with reference to the drawings, which are incorporated in and constitute a part of the specification, in which.

DETAILED DESCRIPTION OF THE INVENTION

Figure 1:
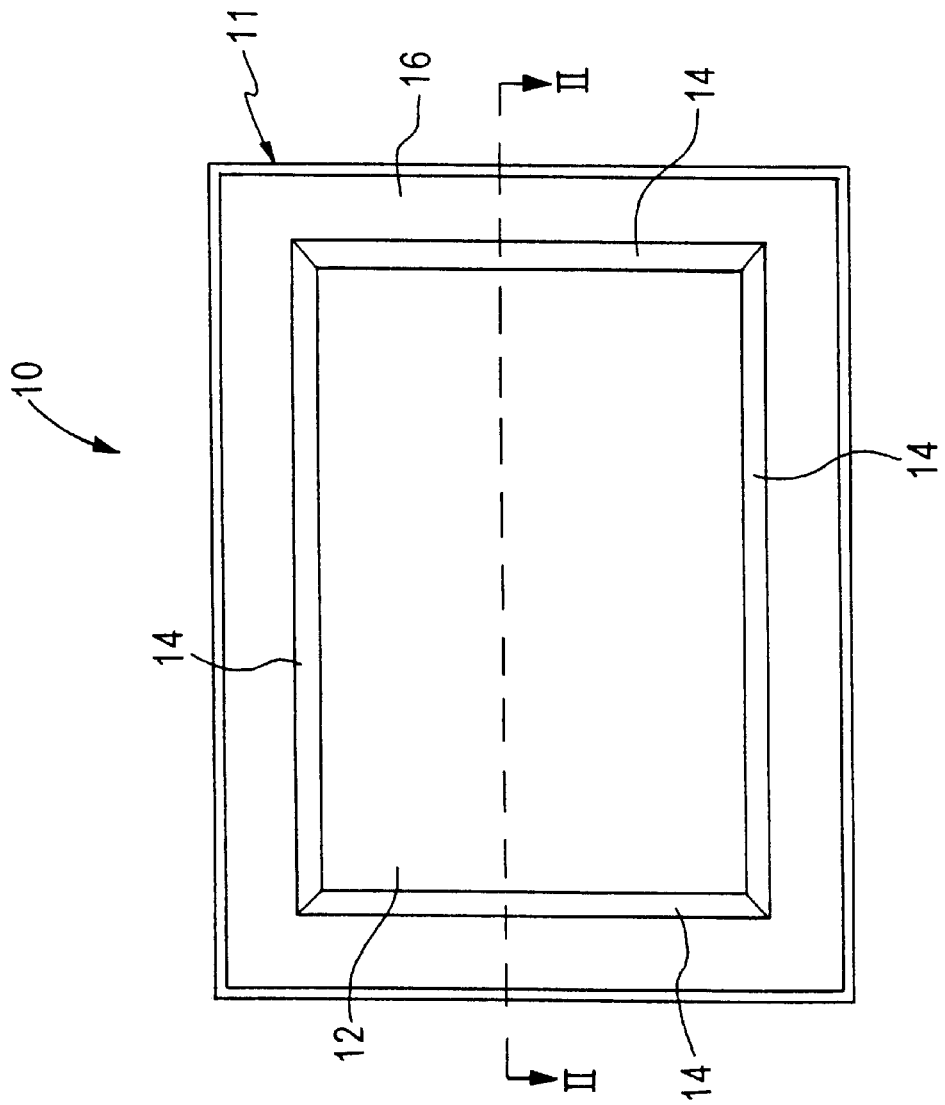
FIG. 1 shows a top view of a conventional heat spreader.
Figure 2:
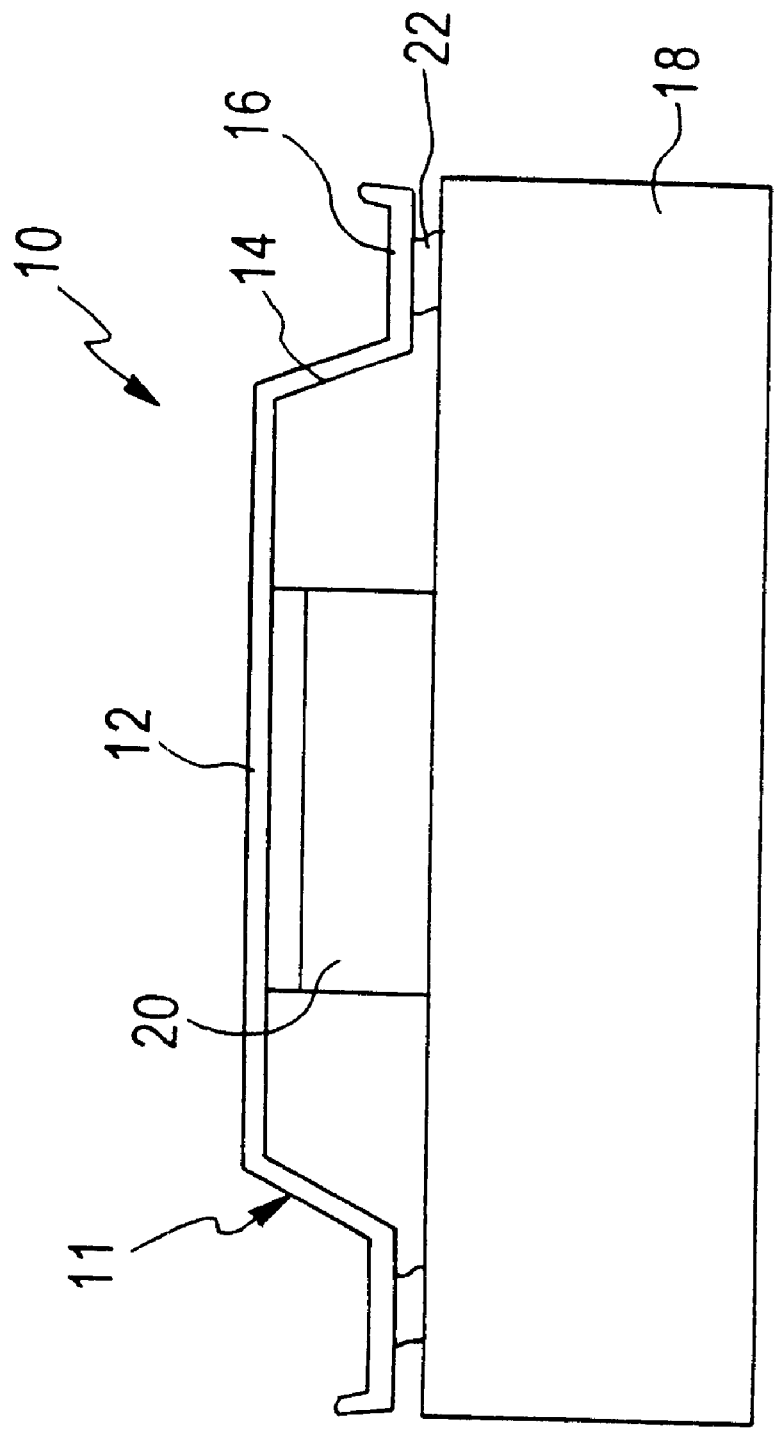
FIG. 2 shows a side sectional view of a conventional heat spreader-package assembly taken along line 11—11 of FIG. 1.
Figure 3:
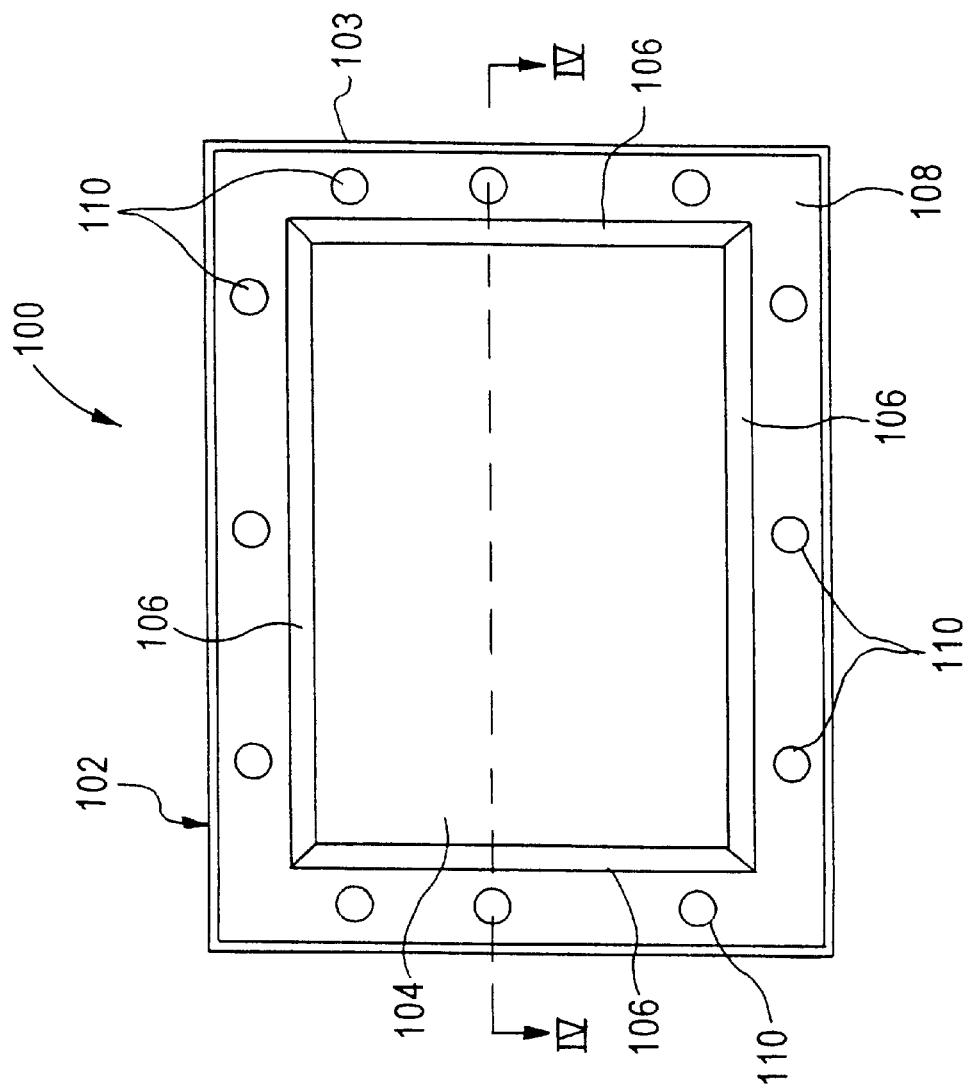
FIG. 3 shows a top view of a heat spreader-package assembly according to an embodiment of the invention.

Referring now to the drawings, and initially to FIG. 3, there will be seen a top view of a heat spreader-package assembly 100 according to an embodiment of the invention. The heat spreader-package assembly 100 has a heat spreader 102 that has an upper portion 104 and sidewalls 106 extending from the edges of the upper portion 104. A flange 103 extends from the sidewalls 106 in a continuous manner about the periphery of the heat spreader 102. The flange 103 has a surface that is substantially planar to the plane of the upper portion 104.

There are a plurality of holes 110 through the flange 108 for mounting the heat spreader 102 in the heat spreader-package assembly 100. There can be any number of holes 110 in the flange 108, but the embodiment of FIG. 3 shows a total of twelve holes 110, i.e., three holes 110 on each side of the flange 108. The holes 110 may be distributed substantially symmetrically as shown in FIG. 3, or the holes 110 may be distributed in a random manner. The holes 110 may be placed only on the sides of the flange 108 or may be placed in the corners, or both. The diameter of the holes 110 preferably comprises approximately fifty percent of the width of the flange 108. This size provides a secure connection when filled with adhesive. Holes of other diameters, however, are also suitable.

Figure 4:
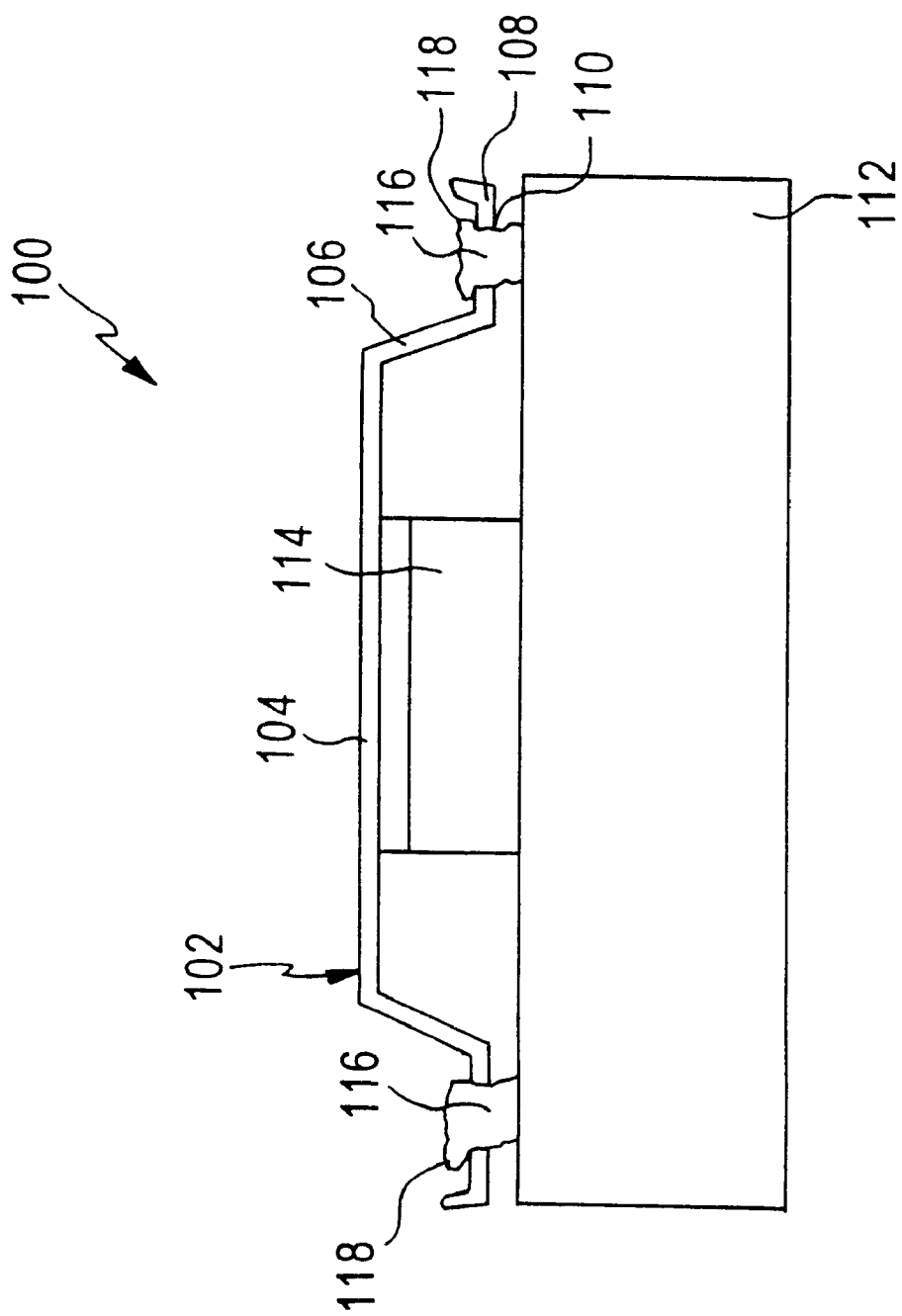
FIG. 4 shows a side sectional view of the heat spreader-package assembly taken along line IV—IV of FIG. 3.

As shown in FIG. 4, the heat spreader-package assembly 100 according to the invention also includes a package board 112 with an integrated circuit die 114 mounted thereon. The heat spreader 102 is mounted to the package board 112 with an adhesive 116. As shown, the adhesive 116 is on both sides of the flange 108 of the heat spreader 102 thereby establishing a riveted connection. As a result, the head 118 of the adhesive 116 acts on the upper surface of the flange 108 to connect the heat spreader 102 firmly to the package board 112. Also, the adhesive 116 expands to fill the holes 110 to provide lateral securement of the heat spreader 102.

The riveted connection formed between the heat spreader 102 and the package board 112 by the holes 110 and the adhesive 116 has the effect of increasing the strength of the heat spreader-package assembly 100 without increasing the number of parts. In addition, if the heat spreader part is stamped and the stamping die has hole punches, then the strength of the adhesion of the heat spreader 102 to the package board 112 is increased while only negligibly increasing the manufacturing cost.

Figure 5:
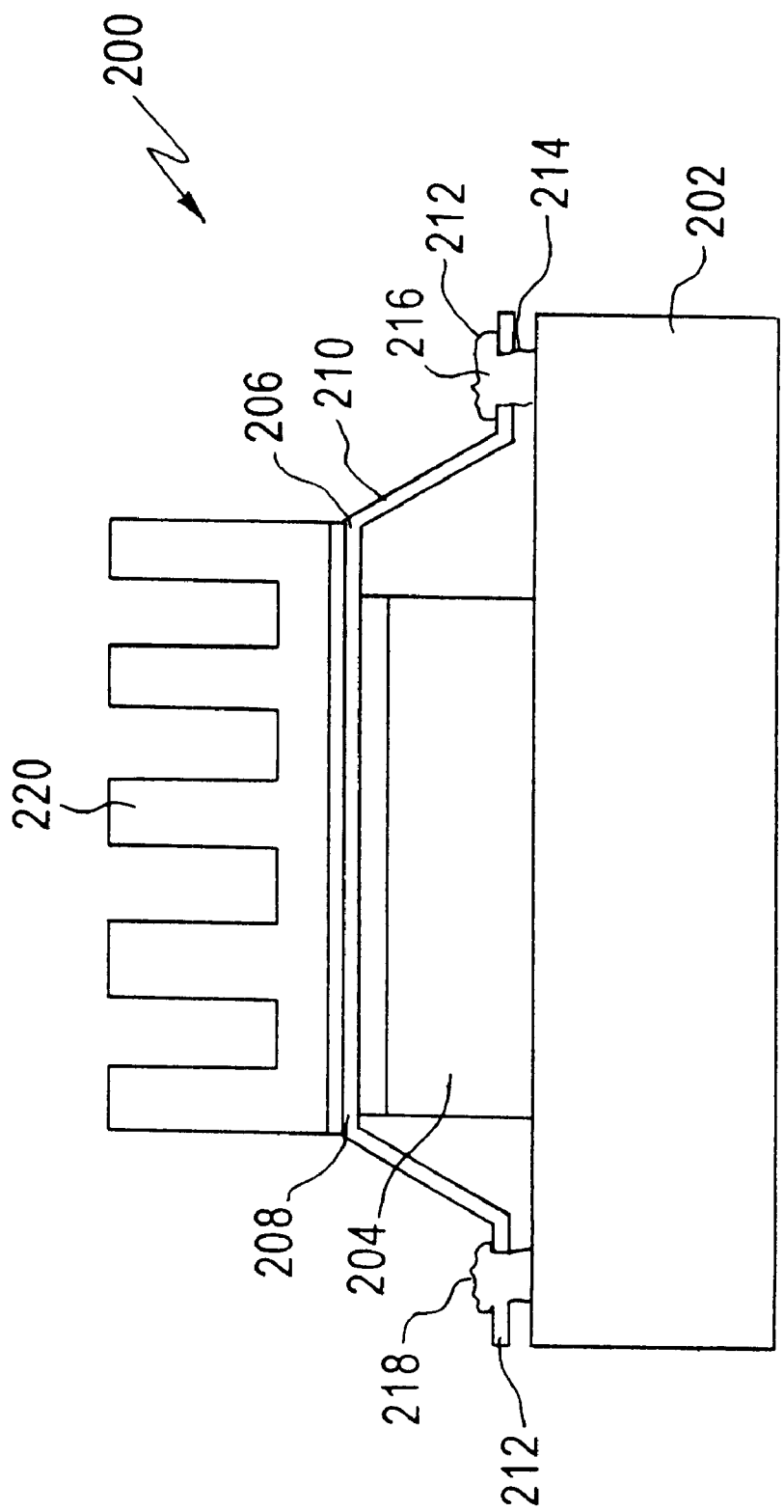
FIG. 5 is a side sectional view of a package assembly according to an embodiment of the invention.

FIG. 5 shows an embodiment of a packaging arrangement according to the invention in which there is a package board 202 with an integrated circuit die 204 mounted thereon.

A heat spreader (or "package lid") 206 is adhered to the package board 202 to protect, and to spread the heat generated by, the integrated circuit die 204. The heat spreader 206 has an upper portion 208. Sidewalls 210 extend from each edge of the upper portion 208. A flange 212 extends from the sidewalls 210 continuously about the periphery of the head spreader 206. There are a plurality of holes 214 in the flange 212 so that an adhesive 216 flows therethrough to mount the heat spreader 206 to the upper surface of the package board 202 to establish a riveted connection. Once the adhesive 216 cures, a head 218 of the riveted connection acts on an upper surface of the flange 212 to stabilize and strengthen the connection between the heat spreader 206 and the package board 202.

A heat sink 220 is mounted to the heat spreader 206, and thermally coupled thereto, to dissipate the heat that is generated by the circuit die 204, which is spread by the heat spreader 206.

An embodiment of the method according to the invention will now be explained. First, a package board 202 having the integrated circuit die 204 connected thereto is supplied. The adhesive 216 is placed on the upper surface of the package board 202. Next, the heat spreader 206 is pressed on the package board 202 with the flange 212 being placed directly on the adhesive 216 so that the adhesive flows through the holes 210 in the flange 212. The adhesive 216 is then cured so that a head 218 is formed thereby creating a riveted connection. The heat sink 220 is then mounted to the upper portion 208 of the heat spreader 206.

There are several advantages to the current invention. For example, the adhesive cures on both sides of the heat spreader to create a riveted connection. In turn, this riveted connection stabilizes the heat spreader-package assembly, because force acts on the upper surface to hold the heat spreader in place. Also, the strength of the heat spreader-package assembly is increased while only negligibly increasing manufacturing costs.

While this invention has been described in connection with what is presently considered to be the most practical and preferred embodiments, it is to be understood that the invention is not limited to the disclosed embodiments, but, on the contrary, is intended to cover various modifications and equivalent arrangements included within the scope of the appended claims.

What is claimed is:

1. A heat spreader for an integrated circuit comprising:
   an upper portion;
   a plurality of sidewalls extending from the upper portion; and
   a flange extending from the sidewalls and having a plurality of holes adapted to allow an adhesive to flow therethrough to establish a riveted connection between the heat spreader and an integrated circuit package.

2. A heat spreader according to claim 1, wherein there are twelve holes disposed about the flange.

3. A heat spreader according to claim 1, wherein there are eight holes disposed about the flange.

4. A heat spreader as claimed in claim 1, wherein the plurality of holes are distributed symmetrically about the flange.

5. A heat spreader as claimed in claim 1, wherein the holes are disposed only in cornes of the flange.

6. An integrated circuit device arrangement comprising:
   a package; and
   a heat spreader mounted to the package and having a flange with a plurality of holes; and
   an adhesive extending through the holes to the package and forming rivets connecting the heat spreader and the package.

7. A heat spreader as claimed in claim 6, wherein the rivets include cured adhesive on both sides of the flange.

8. A heat spreader as claimed in claim 7, wherein the adhesive extends continuously between the flange and an upper surface of the package.

9. A heat spreader as claimed in claim 6, wherein the adhesive is disposed between the flange and an upper surface of the package at locations corresponding only to the plurality of holes.

10. A heat spreader according to claim 6, wherein there are two holes disposed about the flange.

11. A heat spreader according to claim 6, wherein there are four holes disposed about the flange.

12. A heat spreader as claimed in claim 6, wherein the plurality of holes are distributed symmetrically about the flange.

13. A heat spreader as claimed in claim 6, wherein the holes are disposed only in corners of the flange.

14. A method of attaching a heat spreader to a package of a semiconductor device, comprising:
   forming holes in a flange of the heat spreader;
   placing an adhesive on an upper surface of the package;
   bringing the flange of the heat spreader into contact with the adhesive;
   allowing the adhesive to partially flow through the holes; and
   curing the adhesive to establish a riveted connection between the heat spreader and the package.

15. A method as claimed in claim 14, wherein the placing the adhesive step includes placing the adhesive on the upper surface of the package only in positions that correspond to the holes in the flange of the heat spreader.

16. A method as claimed in claim 15, wherein the placing the adhesive step includes placing the adhesive continuously on the upper surface corresponding to the flange of the heat spreader.

* * * * *